United States Patent
Kobayashi et al.

(10) Patent No.: US 8,183,566 B2
(45) Date of Patent: *May 22, 2012

(54) HETERO-CRYSTALLINE SEMICONDUCTOR DEVICE AND METHOD OF MAKING SAME

(75) Inventors: Nobuhiko Kobayashi, Sunnyvale, CA (US); Shih Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 790 days.

This patent is subject to a terminal disclaimer.

(21) Appl. No.: 11/681,068

(22) Filed: Mar. 1, 2007

(65) Prior Publication Data

US 2008/0210936 A1    Sep. 4, 2008

(51) Int. Cl.
*H01L 29/06* (2006.01)

(52) U.S. Cl. .......... 257/51; 257/53; 257/64; 257/65; 257/81; 257/E33.076; 257/E21.09

(58) Field of Classification Search ............ 257/51, 257/53, 64, 65, 81, E33.076, E21.09
See application file for complete search history.

(56) References Cited

U.S. PATENT DOCUMENTS

| | | | |
|---|---|---|---|
| 6,249,010 B1 | 6/2001 | Bergemont et al. | |
| 6,882,051 B2 | 4/2005 | Majumdar et al. | |
| 7,020,372 B2 | 3/2006 | Lee et al. | |
| 7,172,953 B2 | 2/2007 | Lieber et al. | |
| 7,265,037 B2 | 9/2007 | Yang et al. | |
| 7,301,215 B2 * | 11/2007 | Kariya | 257/458 |
| 7,608,530 B2 | 10/2009 | Kobayashi et al. | |
| 2003/0126742 A1 * | 7/2003 | Ting et al. | 29/874 |
| 2006/0019472 A1 | 1/2006 | Pan et al. | |
| 2006/0030132 A1 | 2/2006 | Van Gestel et al. | |
| 2006/0207647 A1 | 9/2006 | Tsakalakos et al. | |
| 2006/0256059 A1 * | 11/2006 | Stumbo et al. | 345/92 |
| 2006/0281321 A1 * | 12/2006 | Conley et al. | 438/703 |
| 2007/0105356 A1 | 5/2007 | Wu et al. | |
| 2007/0221840 A1 | 9/2007 | Cohen et al. | |
| 2007/0257264 A1 | 11/2007 | Hersee et al. | |
| 2008/0173971 A1 * | 7/2008 | Sharma et al. | 257/506 |
| 2008/0241755 A1 | 10/2008 | Franklin et al. | |
| 2009/0188557 A1 | 7/2009 | Wang et al. | |
| 2009/0266974 A1 * | 10/2009 | Verhulst et al. | 250/208.1 |
| 2009/0317044 A1 * | 12/2009 | Buretea et al. | 385/132 |
| 2009/0321715 A1 | 12/2009 | Kobayashi et al. | |

OTHER PUBLICATIONS

Somorjai, Introduction to surface chemistry and catalysis, p. 49, 1994.*

Mark S. Gudiksen et al., Size-Dependent Photoluminescence from Single Indium Phosphide Nanowires, J. Phys. Chem. B, 106 (2002) pp. 4036-4039.

Sreeram Vaddiraju et al., Mechanisms of 1D Crystal Growth in Reactive Vapor Transport: Indium Nitride Nanowires, Nano Letters, vol. 5, No. 8 (2005) pp. 1625-1631.

Pu Xian Gao et al., Three-dimensional Interconnected Nanowire Networks of ZnO, Chem. Phys. Letters, 408 (2005) pp. 174-178.

Wen-Ting Chiou et al., Growth of Single Crystal ZnO Nanowires using Sputter Deposition, Diamond and Related Materials, 12 (2003) pp. 1841-1844. N. P. Kobayashi et al., Growth and characterization of indium phosphide single-crystal nanoneedles on microcrystalline silicon surfaces, Applied Physics A Materials Science & Processing, Aug. 10, 2006, pp. 1-6, 85, copyright Springer-Verlag.

* cited by examiner

*Primary Examiner* — Minchul Yang

(57) ABSTRACT

A hetero-crystalline semiconductor device and a method of making the same include a non-single crystalline semiconductor layer and a nanostructure layer that comprises a single crystalline semiconductor nanostructure integral to a crystallite of the non-single crystalline semiconductor layer.

20 Claims, 6 Drawing Sheets

HETERO-CRYSTALLINE SEMICONDUCTOR DEVICE AND METHOD OF MAKING SAME

STATEMENT REGARDING FEDERALLY SPONSORED RESEARCH OR DEVELOPMENT

N/A

BACKGROUND

1. Technical Field

The invention relates to nanotechnology. In particular, the invention relates to a hetero-crystalline semiconductor device and integrating a single crystalline semiconductor nanostructure with a non-single crystalline semiconductor layer of the semiconductor device.

2. Description of Related Art

Historically, high performance semiconductor devices, especially those with p-n junctions, comprise single crystals of one or more semiconductor materials. Among other things, using such single crystalline materials for semiconductor devices essentially eliminates the scattering of charged carriers (e.g., holes and electrons) at grain boundaries that exist in non-single crystalline semiconductor materials such as polycrystalline semiconductor materials. Such scattering adversely reduces the drift mobility and the diffusion of charged carriers, and leads to a degraded performance (e.g., increased resistance) of devices, such as transistors and solar cells. Even when different semiconductor materials were employed together in a single device, such as in a heterostructure or heterojunction device, single crystalline semiconductor materials are generally chosen based on their respective lattice structures to insure that the structure realized is an essentially single crystalline structure as a whole. Similarly, nanostructures including, but not limited to, nanowires and nanodots are typically nucleated and grown from single crystalline substrates, in part to capitalize on the uniform nature of the lattice of such substrates that provides required crystallographic information for the nanostructures to be grown as single crystals.

Relatively recently, amorphous and other essentially non-single crystalline semiconductor materials have begun to attract attention, in particular, in solar cell applications. While having the disadvantages associated with multiple grain boundaries, such non-single crystalline semiconductor materials can be considerably cheaper to manufacture than their single crystalline counterparts. In many applications, the lower cost of producing the semiconductor device from non-single crystalline materials outweighs any loss of performance that may result. Furthermore, using non-single crystalline semiconductor materials for heterostructures can increase the possible combinations of materials that can be used since lattice mismatch is less of a concern with non-single crystalline semiconductors.

For example, heavily doped polycrystalline silicon (Si) is commonly used instead of or in addition to metal for conductor traces in integrated circuits where the heavy doping essentially overcomes the increased resistivity associated with carrier scattering from the multiple grain boundaries. Similarly, polycrystalline Si is commonly used in solar cells where its relatively lower cost outweighs the decrease in performance associated with the nature of the polycrystalline material. Amorphous semiconductor material is similarly finding applications in solar cells and in thin film transistors (TFTs) for various optical display applications where cost generally dominates over concerns about performance. Unfortunately, the ability to effectively combine non-single crystalline semiconductor materials with single crystalline semiconductor materials to realize semiconductor junction-based devices and heterostructure or heterojunction devices has generally met with little success, in part, due to the disruptive effects that joining a single crystalline layer to a non-single crystalline layer has on the physical properties of the single crystalline layer.

BRIEF SUMMARY

In some embodiments of the present invention, a hetero-crystalline semiconductor device is provided. The hetero-crystalline semiconductor device comprises a first layer of a first semiconductor material having a non-single crystalline structure. The hetero-crystalline semiconductor device further comprises a nanostructure layer that comprises a nanostructure. The nanostructure is a semiconductor material having a single crystalline structure. The nanostructure is integral to a crystallite in the first layer.

In other embodiments of the present invention, a hetero-crystalline semiconductor device is provided. The hetero-crystalline semiconductor device comprises a first layer of a first non-single crystalline semiconductor material having a first energy band gap; and a second layer of a second non-single crystalline semiconductor material having a second energy band gap. The hetero-crystalline semiconductor device further comprises a nanostructure layer comprising nanostructures of a single crystalline semiconductor material having a third energy band gap. A nanostructure of the nanostructure layer is integral to a crystallite in one of the first layer and the second layer. The nanostructure layer is located between the first layer and the second layer. The hetero-crystalline semiconductor device further comprises separate electrical contacts to the first layer and the second layer. The nanostructures are electrically accessible by the separate electrical contacts.

In other embodiments of the present invention, a method of making a hetero-crystalline semiconductor device is provided. The method of making comprises forming a first layer of a first non-single crystalline semiconductor material on a surface of a substrate. The method of making further comprises growing a nanostructure of a single-crystalline semiconductor material from a crystallite in the first layer such that the nanostructure is integral to the crystallite.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
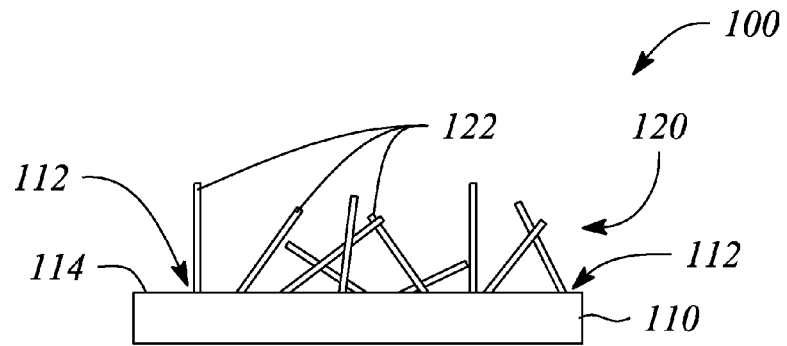
FIGS. 1A-1B illustrate side views of a hetero-crystalline semiconductor device according to various embodiments of the present invention.

Embodiments of the present invention facilitate and provide a hetero-crystalline semiconductor device. A hetero-crystalline semiconductor device is defined herein as a semiconductor device that comprises a non-single crystalline material layer and a nanostructure layer having a single crystalline nanostructure that is integral to (i.e., nucleated and grown from) the non-single crystalline material layer. In particular, individual nanostructures within the nanostructure layer are associated with short-range atomic ordering of the non-single crystalline material layer. Crystallographic information associated with the short-range atomic ordering is transferred to the nanostructure during growth of the nanostructure. The integral crystal-structure connection at the interface between the non-single crystalline material layer and the single crystalline semiconductor nanostructure layer facilitates using the interface for a variety of semiconductor junction-related applications including, but not limited to, optoelectronic devices (e.g., photodetectors, LEDs, lasers and solar cells) and electronic devices (e.g., tunneling diodes and transistors).

According to some embodiments, the hetero-crystalline semiconductor device comprises a semiconductor junction provided by selective doping within or between the layers. For example, a p-n junction may be formed when the nanostructure layer is doped with an n-type dopant and the non-single crystalline material layer is a semiconductor material doped with a p-type dopant. In another example, a p-n junction is formed entirely within the nanostructure layer. In other embodiments, an intrinsic layer is formed between a p-region and an n-region to yield a p-i-n junction within the hetero-crystalline semiconductor device. For example, a portion of the nanostructure layer may be n-doped while another portion thereof is essentially undoped (e.g., intrinsic) and the non-single crystalline semiconductor layer is p-doped. In other embodiments, multiple p-n junctions, p-i-n junctions and combinations thereof are formed in or between the nanostructure layer(s) and non-single crystalline semiconductor layer(s) as is discussed in more detail below. For simplicity of discussion and not by way of limitation, the term 'p-n junction' means herein one or both of the p-n junction and the p-i-n junction unless explicit distinction is necessary for proper understanding.

Further, according to various embodiments, the hetero-crystalline semiconductor device may comprise a heterostructure or a heterojunction semiconductor device. For example, semiconductor materials having differing band gaps are employed to respectively realize the nanostructure layer and the non-single crystalline semiconductor layer of some hetero-crystalline semiconductor device embodiments of the present invention. The hetero-crystalline semiconductor device that comprises such differing materials is termed a heterostructure hetero-crystalline semiconductor device.

Herein, a non-single crystalline material is defined as having short range atomic ordering and as such, the material lacks long-range atomic ordering. In contrast, as used herein, a single crystalline semiconductor material has a crystal lattice that is essentially continuous in micrometer scale, as generally defined for a single crystal. In some embodiments, the short range atomic ordering ranges in extent from 1 nanometer to about 100 microns. The short range atomic ordering manifests as multiple, small regions of crystalline material or crystallites dispersed within and generally throughout the non-single crystalline material. The regions of crystallites may range from clusters of individual crystallites to discrete individual crystallites. Thus, the non-single crystalline material comprises multiple crystallites buried in a non-single crystalline matrix. The crystallites in the non-single crystalline material essentially define the short range atomic ordering.

The term 'hetero-crystalline' is defined herein as a structure comprising at least two different types of structural phases. In particular, herein a hetero-crystalline structure comprises at least a non-single crystalline material having crystallites and a single crystalline material that is integral to a crystallite of the non-single crystalline material.

With respect to the various embodiments of the present invention, the non-single crystalline material having short-range atomic ordering provides a template for nucleation and growth of a single crystalline nanometer-scale semiconductor structure (i.e., 'nanostructure'). In particular, a crystallite of the non-single crystalline material layer provides a nucleation site for growth of a nanostructure. The nucleation site includes within its scope, but is not limited to, growing one or more nanostructures either from a single crystallite or from an aggregate or cluster of crystallites, depending on the size of crystallites. For example, if the size of a single crystallite is 'large' compared to the size of a nanostructure, more than one nanostructure may grow from the single crystallite. On the other hand, if the size of a single crystallite is 'small' compared to the size of the nanostructure, but many such crystallites aggregate to form a large crystallite area, then a single nanostructure, or even multiple nanostructures, can grow from such a group of crystallites. As used herein, the term 'crystallite' means a range of crystallites from a single crystallite to a group of crystallites aggregated together for the purposes of the various embodiments of the present invention. The grown nanostructure forms an interface with the crystallite where the nanostructure is connected to the crystallite commensurately. As such, the nanostructure is said to be integral to a crystallite of the non-single crystalline material.

In some embodiments, the semiconductor nanostructures are nanowires. A nanowire is an individual quasi-one dimensional, nano-scale, single crystalline structure typically characterized as having two spatial dimensions or directions that are much less than a third spatial dimension or direction. The presence of the third, greater dimension in nanowires facilitates electron wave functions along that dimension while conduction is quantized in the other two spatial dimensions. A nanowire may be referred to as a nanowhisker or a nanoneedle. As used herein, the term nanowire is defined as a nano-scale single crystalline semiconductor structure, as described above, having an axial length (as a major or third spatial dimension), opposite ends and a solid core. In some embodiments, the nanostructure is a nanotube that is characterized as having two spatial dimensions or directions that are much less than a third spatial dimension or direction. A nanotube is defined as a nano-scale single crystalline semiconductor structure having an axial length (as a major or third spatial dimension), opposite ends and, in contrast to a nanowire, has a hollow core. In other embodiments, the nanostructure is a nanodot (i.e., a quantum dot (QD)). A nanodot is a single crystalline, quasi zero-dimensional semiconductor nanostructure that is nanometer-scale (i.e., nano-scale) in all three spatial dimensions or directions and electron wave functions in the nanodot is quantized in all three spatial dimensions.

Each of the above-mentioned nanostructures may be nucleated and grown from non-single crystalline materials having short range atomic ordering, i.e., the non-single crystalline material layer, according to the various embodiments herein. As such, a wide variety of materials are available to manufacture the hetero-crystalline semiconductor device embodiments of the present invention. The wide variety of available non-single crystalline materials may provide a plethora of potential device applications. For example, the hetero-crystalline semiconductor device according to various embodiments herein include, but are not limited to, a solar cell, a laser, a photodetector, a light emitting diode (LED), a transistor and a diode.

In addition, using a wide variety of non-single crystalline semiconductor materials may provide cost and manufacturing advantages as well as performance advantages to the hetero-crystalline semiconductor device according to some embodiments. For example, a solar cell device that can be manufactured using non-single crystalline semiconductor materials may be one or both of more cost-effective to make and more efficient compared to conventional solar cells based on single crystalline silicon, according to some embodiments, simply due to the fact that expensive single crystal substrates are not necessary and a broader range of materials that are available for solar cell structures. Material and relevant manufacturing costs for non-single crystalline semiconductor materials are generally cheaper than those for single crystalline semiconductor materials. Moreover, the greater variety of these available materials may provide for energy conversion from more of the solar spectrum than previously available, which may improve solar cell efficiency according to some embodiments. In addition, some of the hetero-crystalline semiconductor device embodiments of the present invention provide for smaller or more compact construction.

For the purposes of the various embodiments herein, the article 'a' or 'an' is intended to have its ordinary meaning in the patent arts, namely 'one or more'. For example, 'a nanostructure' means 'one or more nanostructures' and as such, 'the nanostructure' means 'the nanostructure(s)' herein. Moreover, 'a crystallite' means 'one or more crystallites' and includes within its scope 'a group of crystallites', as defined above. It is irrelevant whether a particular layer is described herein as being on a top or upper side, a bottom or lower side, or on a left side or a right side of other layers of the hetero-crystalline semiconductor device. Therefore, any reference herein to 'top', 'bottom', 'upper', 'lower', 'left' or 'right' with respect to the layers is not intended to be a limitation herein. Examples described herein are provided for illustrative purposes only and not by way of limitation.

Figure 1B:
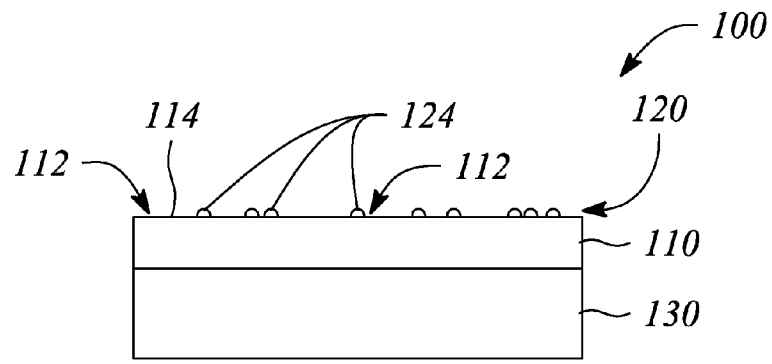

In some embodiments of the present invention, a hetero-crystalline semiconductor device is provided. FIGS. 1A and 1B illustrate side views of a hetero-crystalline semiconductor device 100 according to various embodiment of the present invention. The hetero-crystalline semiconductor device 100 comprises a first layer 110 that is a first non-single crystalline semiconductor material. The first non-single crystalline semiconductor material of the first layer 110 comprises crystallites 112. In some embodiments, the various crystallites 112 range in size from 1 nm and about 100 microns. Adjacent crystallites 112 within the first layer 110 have respective lattices that are essentially randomly oriented with respect to one another, according to some embodiments. Further, crystallites 112 adjacent to a surface 114 of the first layer 110 are essentially randomly located across the surface 114.

The hetero-crystalline semiconductor device 100 further comprises a nanostructure layer 120. The nanostructure layer 120 comprises a nanostructure 122, 124. The nanostructure 122, 124 of the nanostructure layer 120 is a single crystalline semiconductor material. In FIGS. 1A-1B, a plurality of the nanostructures is illustrated by way of example. Further, as illustrated in FIG. 1A, the nanostructures are one or both of nanowires and nanotubes 122. Hereinafter, the nanostructures 122 in FIG. 1A may be referred to as just 'nanowires 122', for simplicity of discussion and not by way of limitation. In FIG. 1B, the nanostructures are illustrated as nanodots 124.

The nanostructure 122, 124 is integral to a crystallite 112 in the first non-single crystalline semiconductor material of the first layer 110. As discussed above, by 'integral to', it is meant that the crystallite 112 of the first layer 110 and the single crystalline nanostructure 122, 124 form an interface where the lattice of the nanostructure 112, 124 is coherent with the lattice of the crystallite. The crystallite 112 provides a nucleation site for the epitaxial growth of the single crystalline nanostructure 122, 124 during manufacturing of the hetero-crystalline semiconductor device 100. As such, the nanostructure 122, 124 is at least physically anchored to the crystallite 112 of the first layer 110. FIG. 1A illustrates the nanowires 122 anchored at a first end of the nanowire 122 to the respective crystallites 112, while a second end of the nanowire 122 that is opposite to the first end is free.

Moreover, since the crystallites 112 of the non-single crystalline material have randomly oriented crystal lattices in adjacent crystallites 112, the direction of nanostructure growth is essentially random. FIG. 1A further illustrates the random directions of the nanostructures 122 by way of example. Furthermore, the crystallites 112 are randomly located in the surface 114 of the first layer 110 and not all crystallites 112 in the surface 114 will nucleate growth of a nanostructure 122, 124. As such, growth of the nanostructure 122, 124 in any particular location on the surface 114 of the first layer 110 is also essentially random. FIGS. 1A and 1B further illustrate the random locations of the nanostructures 122, 124 grown on the surface 114 of the first layer 110 by way of example.

In some embodiments, the hetero-crystalline semiconductor device 100 further comprises a substrate 130, as illustrated in FIG. 1B. The substrate 130 is adjacent to the first layer 110 in FIG. 1B and provides mechanical support to the first layer 110. In some embodiments, the function of the substrate 130 is to provide mechanical support to the first layer 110. In other embodiments, the substrate 130 may provide addition functionality including, but not limited to, an electrical interface to the hetero-crystalline semiconductor device 100. In general, a broad range of materials are useful as the substrate 130 for the hetero-crystalline semiconductor device 100 of the various embodiments herein.

For example, the material of the substrate 130 includes, but is not limited to, a glass, a ceramic, metal, a plastic, a polymer, a dielectric and a semiconductor. A semiconductor substrate material includes materials that have one of no crystallographic structure (e.g., amorphous), a non-single crystalline structure (i.e., having crystallites) and a single crystalline structure. In some embodiments, the substrate material is chosen at least for its ability to withstand manufacturing temperatures at or above about 100 degrees centigrade (° C.). In various embodiments, the substrate 130 may be one of rigid, semi-rigid and flexible, depending on specific applications of the hetero-crystalline semiconductor device 100. Moreover, the substrate 130 may be one of opaque, transparent and semi-transparent to electromagnetic radiation in one or more of visible, ultra-violet (UV) and infra-red (IR) spectrums, depending on various embodiments of the present invention.

Figure 2A:
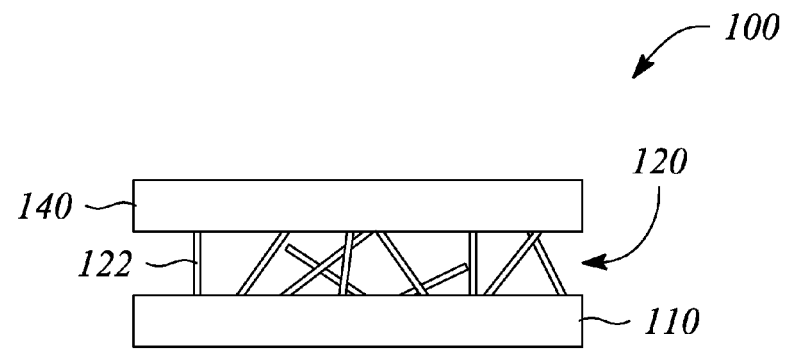
FIGS. 2A-2B illustrate side views of a hetero-crystalline semiconductor device according to other various embodiments of the present invention.
Figure 2B:
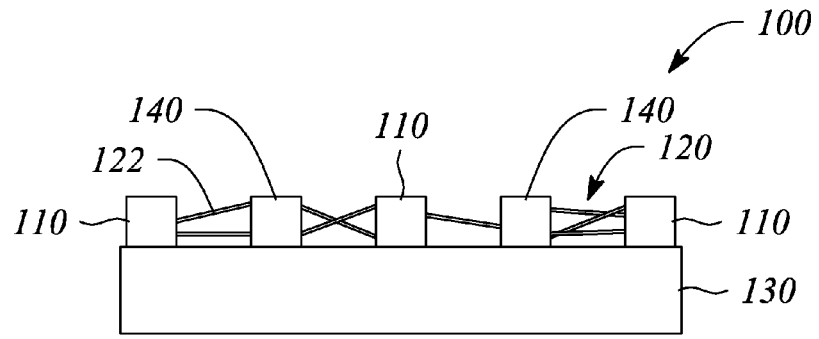

In some embodiments, the hetero-crystalline semiconductor device 100 further comprises a second layer 140 that is a second non-single crystalline semiconductor material. FIGS. 2A-2B illustrate a hetero-crystalline semiconductor device 100 according to various embodiments of the present invention. The second layer 140 is located such that the nanostructure layer 120 is located between the first layer 110 and the second layer 140 according to various embodiments.

As illustrated in FIG. 2A, the second layer 140 is located in a vertically stacked relationship with the nanostructure layer 120 and the first layer 110. In FIG. 2B, the second layer 140 alternates with the first layer 110 as discrete segments on the substrate 130. The substrate 130 further provides at least mechanical support to the second layer 140 in this embodiment. The nanostructure layer 120 includes the nanostructures 122 extending laterally between vertical sidewalls of adjacent discrete segments of the first layer 110 and the second layer 140. For example, the first ends of the nanostructures 122 are integral to respective crystallites 112 at the vertical sidewall surface of the first layer 110 segment. The second ends of the nanostructures 122 are in contact with the adjacent second layer 140 segment. In addition or alternatively, the first ends of some nanostructures 122 are integral to respective crystallites 112 at the vertical sidewall surface of the second layer 140 segment. The second ends of these nanostructures 122 are in contact with the first layer 110 segment.

A non-single crystalline material includes, but is not limited to, an insulator, a semiconductor, a metal and a metal alloy. For the purposes of the various embodiments of the present invention, the non-single crystalline material used herein is a semiconductor material. In some embodiments, one or both of a metal material and metal alloy material may be used as a non-single crystalline layer in the present invention due to their non-insulative character (i.e., an inherent non-insulator or inherently electrically conductive), depending on the device application.

The non-single crystalline semiconductor materials of the first layer 110 and the second layer 140 independently include, but are not limited to, Group IV semiconductors, compound semiconductors from Group III-V and compound semiconductors from Group II-VI. As such, the semiconductor material of the first layer 110 may be the same as or different from the semiconductor material of the second layer 140. Moreover, the crystalline structure of the crystallites in the semiconductor material of the first layer 110 independently may be the same as or different from the crystalline structure of the crystallites of the semiconductor material of the second layer 140. For example, the first layer 110 may comprise silicon (Si) in a non-single crystalline film while the second layer 140 may comprise germanium (Ge) or gallium arsenide (GaAs) in a non-single crystalline film. In another example, the first layer 110 may comprise a hydrogenated silicon (Si:H) non-single crystalline film while the second layer 140 comprises non-single crystalline silicon (Si).

The single crystalline semiconductor materials of the nanostructure layer 120 also independently include, but are not limited to, Group IV semiconductors, compound semiconductors from Group III-V and compound semiconductors from Group II-VI. Therefore, the semiconductor material of the nanostructures in the nanostructure layer is 120 may be the same as or different from the semiconductor material of one or both of the first layer 110 and the second layer 140. However, the semiconductor nanostructures are single crystalline while the semiconductor first layer 110 and the semiconductor second layer 140 are independently both non-single crystalline layers. For example, the semiconductor material of the first layer 110, the nanostructures 122 and when present, the second layer 140 may each be silicon. In another example, the semiconductor material of the first layer 110 may be Si:H, the semiconductor material of the nanostructures 122 may be indium phosphide (InP), and the semiconductor material of the second layer, if present, may be Si.

Concomitant with a choice of the semiconductor materials independently used in the first layer 110, the nanostructure layer 120 and the second layer 140 is a respective energy band gap of the respective layers 110, 120, 140. In some embodiments of the hetero-crystalline semiconductor device 100, the energy band gap of the nanostructure layer 120 is different from the energy band gap of one or both of the first layer 110 and the second layer 140. In some embodiments, the energy band gap of the first layer 110 is different from the energy band gap of the second layer 140. In other embodiments, the energy band gaps of the first layer 110 and the second layer 140 are the same. Using materials with different energy band gaps makes the hetero-crystalline semiconductor device 100 a heterostructure device.

In some embodiments of the hetero-crystalline semiconductor device 100 as illustrated in FIGS. 1A and 1B, the energy band gap of the nanostructure layer 120 is less than the energy band gap of the first layer 110. In other embodiments, the energy band gap of the nanostructure layer 120 is greater than the energy band gap of the first layer 110. In some embodiments of the hetero-crystalline semiconductor device 100 as illustrated in FIGS. 2A-2B, the energy band gap of the nanostructure layer 120 is less than the energy band gaps of one or both of the first layer 110 and the second layer 140. In other embodiments of the hetero-crystalline semiconductor device 100 illustrated in FIGS. 2A-2B, the energy band gap of the nanostructure layer 120 is greater than the energy band gaps of one or both of the first layer 110 and the second layer 140.

For example, in one or more of a solar cell application, LED application, laser application and photodetector application, the energy band gap of the nanostructure layer 120 may be less than the energy band gaps of both the first and second layers 110, 140 (i.e., a 'high-low-high' band gap heterostructure) of the hetero-crystalline semiconductor device 100. In solar cell applications, for example, such a high-low-high heterostructure may enhance the performance of the device by improving a spectral response of the solar cell. In another example, a low-high-low band gap heterostructure may be used for resonant tunneling diode applications. In particular, in such applications, the energy band gap of the nanostructure layer 120 may be greater than the energy band gaps of both the first layer 110 and the second layer 140 (i.e., the 'low-high-low' band gap heterostructure).

In some embodiments (not illustrated), the hetero-crystalline semiconductor device 100 may further comprise another nanostructure layer on the second layer 140 of the device in FIG. 2A, wherein the nanostructures of the nanostructure layer 120 are integral to crystallites in the second layer 140 in much the same way as described above for the nanostructures 122, 124 and the first layer 110. As such, a multilayer device structure that comprises multiple alternating layers of non-single crystalline materials and single crystalline semiconductor nanostructures, as described above for the hetero-crystalline semiconductor device 100 in FIG. 2A, for example, in a vertically stacked relationship are within the scope of the various embodiments of the present invention. For a device with laterally adjacent multiple layers, see the hetero-crystalline semiconductor device 100 of FIG. 2B, for example.

Figure 3:
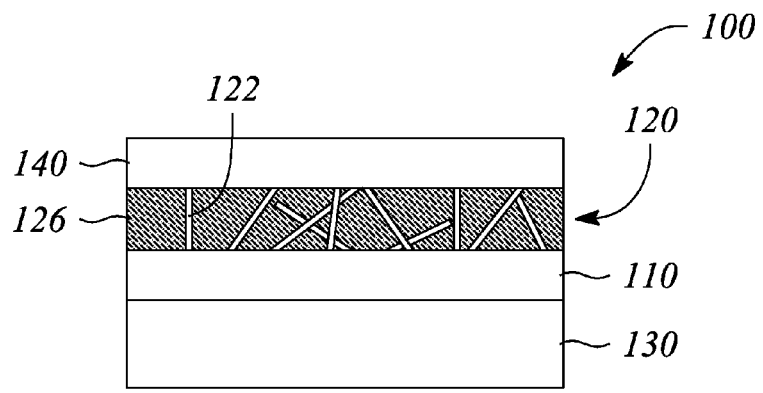
FIG. 3 illustrates a side view of a hetero-crystalline semiconductor device that further includes an encapsulant material according to another embodiment of the present invention.

In some embodiments, the nanostructure layer 120 further comprises an encapsulant material in which the nanostructures 122, 124 are embedded. FIG. 3 illustrates a side view of the hetero-crystalline semiconductor device 100 that further includes an encapsulant material 126 according to an embodiment of the present invention. In this embodiment, the second ends of the nanostructures 122 are exposed in the encapsulant material 126 to allow the nanostructures 122 to make contact with the second layer 140. In FIG. 3, the second layer 140 is located on the nanostructure layer 120 such that the second ends of the nanostructures 122 themselves make contact with the second non-single crystalline semiconductor material of the second layer 140.

In some embodiments, the encapsulant material 126 is an insulator material including, but not limited to, one or more of an oxide, a nitride and a carbide of any of the semiconductor materials listed above. For example, the encapsulant material 126 may be one or more of silicon dioxide, silicon nitride or silicon carbide. In other embodiments, the encapsulant material 126 may be one or more of an oxide, a nitride, and a carbide of a metal, such as titanium or gallium, for example. In some embodiments, the encapsulant material 126 is an insulator material that includes, but is not limited to, a polymer that can withstand device processing temperatures above about 100° C. For example, the polymer insulator material may be polyimide. In some embodiments, the encapsulant material 126 is one of transparent and semi-transparent to electromagnetic radiation in one or more of visible, UV and IR spectrums. Although not illustrated in FIG. 2B, the embodiment of the hetero-crystalline device 100 illustrated in FIG. 2B may further comprise such an encapsulating material that embeds the laterally extending nanostructures 122.

According to various embodiments, the first layer 110, the second layer 140 and the nanostructures 122, 124 of the nanostructure layer 120 of the hetero-crystalline semiconductor device 100 are doped with a dopant material to provide a level of electrical conductivity to the respective layers or structures. In some embodiments, the hetero-crystalline semiconductor device 100 further comprises a p-n junction. For example, in one or more of a solar cell, an LED, a laser and a photodetector application, the hetero-crystalline semiconductor device 100 comprises a p-n junction. In other examples, the hetero-crystalline semiconductor device 100 comprises a Schottky junction instead of or in addition to the p-n junction.

Figure 4A:
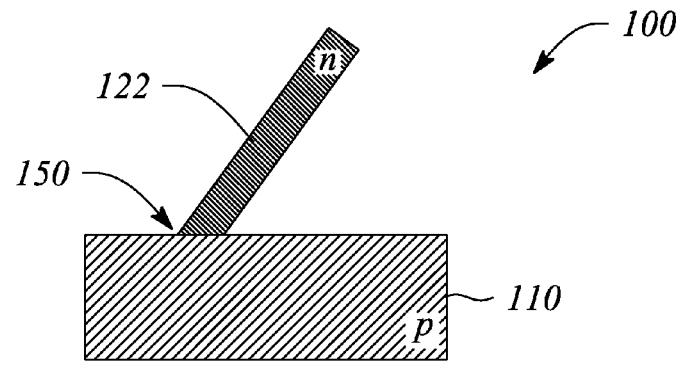
FIGS. 4A-4B illustrate magnified views of exemplary p-n junctions in a hetero-crystalline semiconductor device according to various embodiments of the present invention.
Figure 4B:
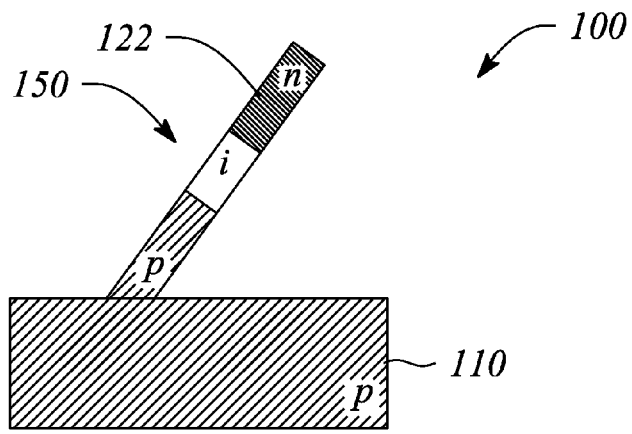

FIGS. 4A-4B illustrate magnified views of exemplary p-n junctions 150 in the hetero-crystalline semiconductor device 100 according to various embodiments of the present invention. FIG. 4A illustrates a p-n junction 150 in the hetero-crystalline semiconductor device 100 formed between the nanostructure 122 and the first layer 110 according to an embodiment of the present invention. In this embodiment, the first layer comprises a p-type dopant material and the nanostructure 122 comprises an n-type dopant material, for example. FIG. 4B illustrates a p-n junction 150 formed in the nanostructure 122. In this embodiment, the first layer 110 comprises a p-type dopant material and the nanostructure 122 comprises both a p-type dopant material and an n-type dopant material in separate regions along the axial length of the nanostructure 122. A first region of the nanostructure 122 adjacent to the first end comprises a p-type dopant material. A second region of the nanostructure 122 adjacent to the second end comprises an n-type dopant material.

Moreover, the level of doping in each layer may be the same or different. For example, in the embodiment illustrated in FIG. 4B, the first layer 110 may comprise a first quantity of the p-type dopant material while the first region of the nanostructure 122 may comprise a second quantity of the p-type dopant that is one of less than, same as, and more than the first quantity. The variation in dopant level may yield a dopant gradient, for example. In another example of differential doping, the first layer 110 may be heavily doped to yield a p+ region providing a low resistivity within the first layer 110 while the p-doped region of the nanostructure 122 may be less heavily p-doped to yield a p region. In some embodiments, an intrinsic (i.e., "i") region is formed in the junction 150 between the p and n dopant regions of the hetero-crystalline semiconductor device 100. FIG. 4B further illustrates an intrinsic region i in the nanostructure 122 by way of example.

In some embodiments, the p-n junction 150 is located between the first layer 110 and the second layer 140 of the hetero-crystalline semiconductor device 100. FIGS. 4C-4G illustrate magnified views of a portion of the hetero-crystalline semiconductor device 100 illustrated in FIG. 2B that has the p-n junction 150 in various regions between the first layer 110 and the second layer 140 according to various embodiments of the present invention. In each of the FIGS. 4C-4G, the first layer 110 comprises a p dopant and the second layer 140 comprises the n dopant, for example.

Figure 4C:
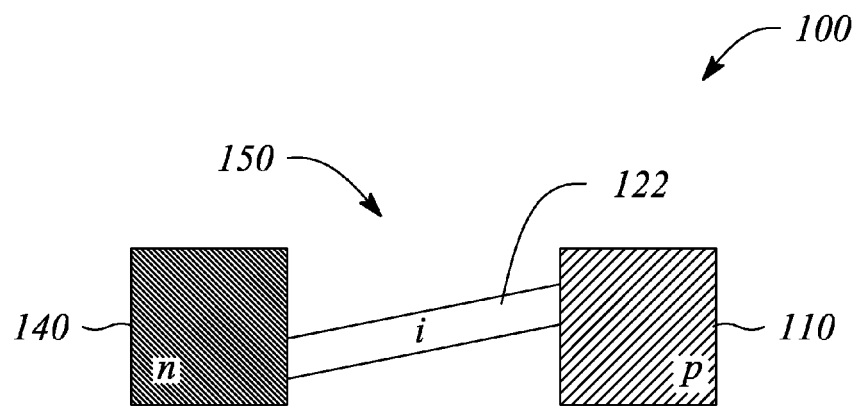
FIGS. 4C-4G illustrate magnified views of exemplary p-n junctions in a portion of the hetero-crystalline semiconductor device of FIG. 2B according to various embodiments of the present invention.
Figure 4D:
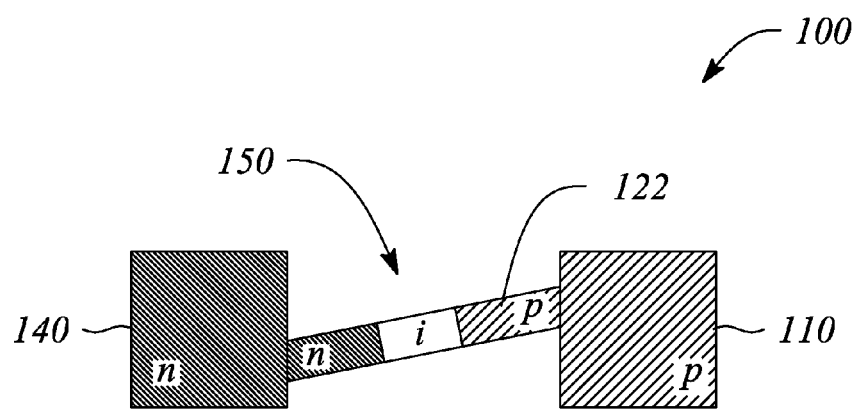
Figure 4E:
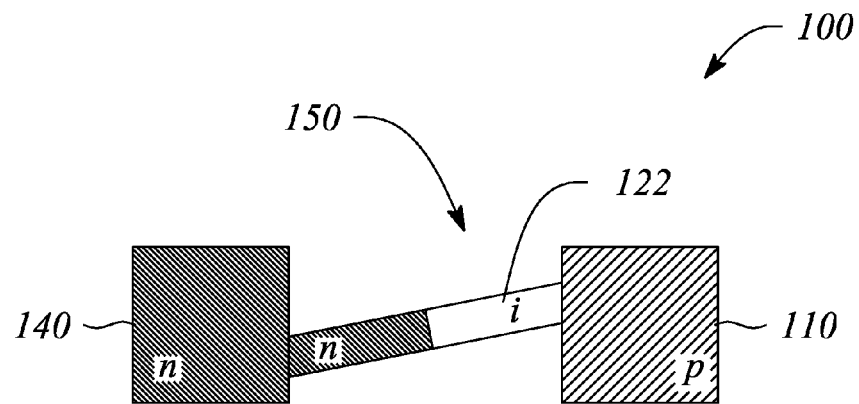
Figure 4F:
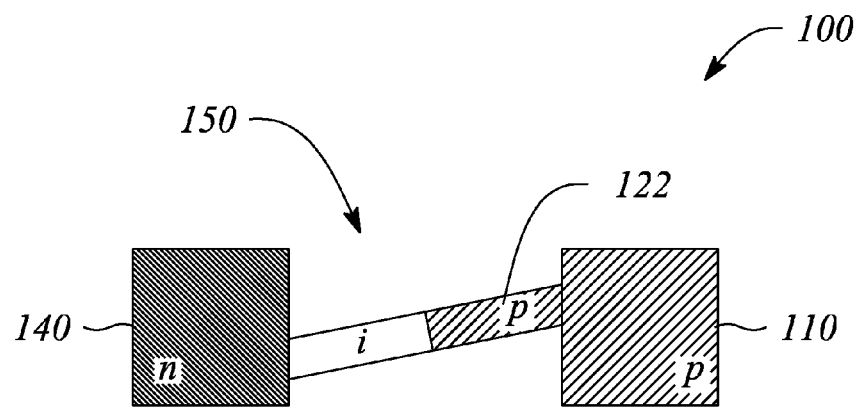
Figure 4G:
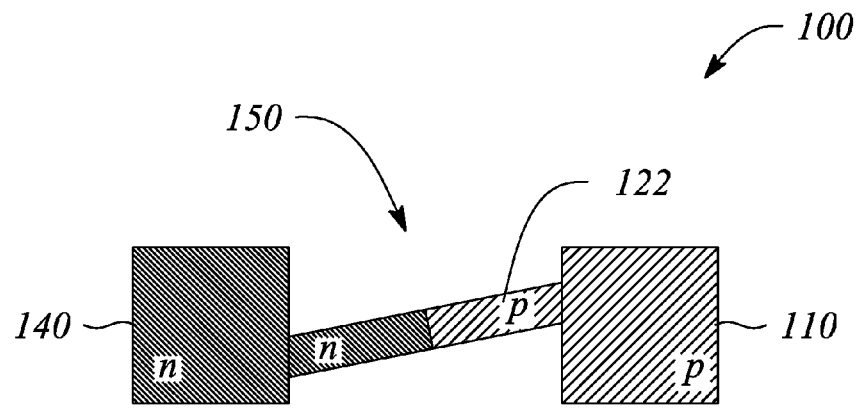

In the embodiment illustrated in FIG. 4C, the nanostructure 122 is the p-n junction 150 and comprises the intrinsic region i. In the embodiment illustrated in FIG. 4D, a first region of the nanostructure 122 adjacent to the first layer 110 comprises a p-type dopant, while a second region of the nanostructure 122 adjacent to the second layer 140 comprises an n-type dopant. The p-n junction 150 is formed in the intrinsic region i between the p doped region and the n doped region of the nanostructure 122. In the embodiment illustrated in FIG. 4E, the second region of the nanostructure 122 that is adjacent to the second layer 140 comprises an n-type dopant while the first region adjacent to the first layer 110 is the intrinsic region i of the p-i-n junction 150. FIG. 4F illustrates an embodiment wherein the first region of the nanostructure 122 that is adjacent to the first layer 110 comprises a p-type dopant while the second region adjacent to the second layer 140 is the intrinsic region i of the p-i-n junction 150. In FIGS. 4E and 4F, a dopant gradient may be formed between the respective doped region of the nanostructure 122 and the respective adjacent layer 110, 140 similar to the p dopant gradient example described above for the embodiment illustrated in FIG. 4B, for example. FIG. 4G illustrates the p-n junction 150 in the nanostructure 122. Other variations on the location and doping of the hetero-crystalline semiconductor device 100 exist and are within the scope of the present invention. For example, the nanostructure 122, 124 may incorporate one or both of more than one p-n junction or more than one p-i-n junction.

For example, in some embodiments of a solar cell application (not illustrated), the hetero-crystalline semiconductor device 100 comprises a plurality of different single crystalline semiconductor material layers and a plurality of different non-single crystalline semiconductor material layers, arranged according to any of the hetero-crystalline semiconductor device 100 embodiments described above in a multilayer device structure; and a plurality of p-n junctions, located according to any of the p-n junction embodiments described above. A spatial arrangement of the plurality of p-n junctions covers a large effective area over which sun light is received by the hetero-crystalline semiconductor device 100. Further, the different material layers of the multilayer device structure convert a wide range of the solar spectrum. Such a multilayer, multi-junction solar cell hetero-crystalline semiconductor device 100 has increased efficiency and performance that correspond to the increased number of different layers and p-n junctions.

For LED, laser and photodetector applications, each nanostructure 122, 124 of the hetero-crystalline semiconductor device 100, or the hetero-crystalline device 100 itself, is associated with at least one p-n junction according to the present invention. Any of the hetero-crystalline semiconductor device 100 p-n junctions illustrated in FIG. 4A-4G may be a building block of various electronic and optoelectronic devices such as resonant tunneling diodes, transistors, lasers, LEDs, photodetectors, and solar cells, according to some embodiments of the present invention. Moreover, the semiconductor materials of the first and the second layers 110, 120 may be the same or different. In some embodiments of the invention, the third semiconductor layer 120 of the resonant tunneling diode device 100 comprises a nanostructure 122, 124 that is a single crystalline semiconductor material; and one or both of the first semiconductor layer 110 and the second semiconductor layer 140 is a non-single crystalline semiconductor material.

Figure 5A:
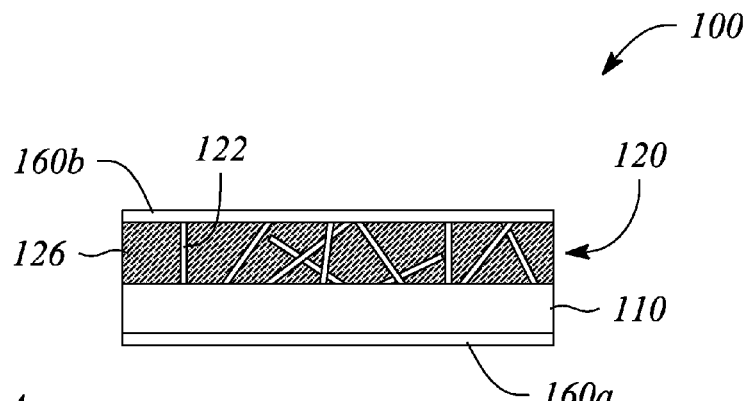
FIG. 5A illustrates a side view of the hetero-crystalline semiconductor device of FIG. 1A further including electrical contacts according to an embodiment of the present invention.
Figure 5B:
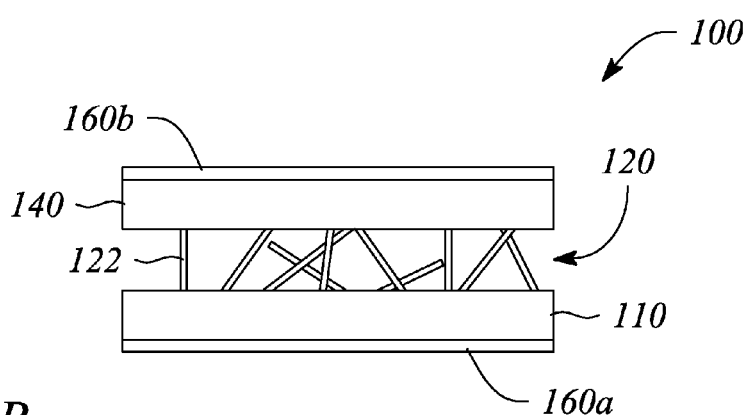
FIG. 5B illustrates a side view of the hetero-crystalline semiconductor device of FIG. 2A further including electrical contacts according to an embodiment of the present invention.
Figure 5C:
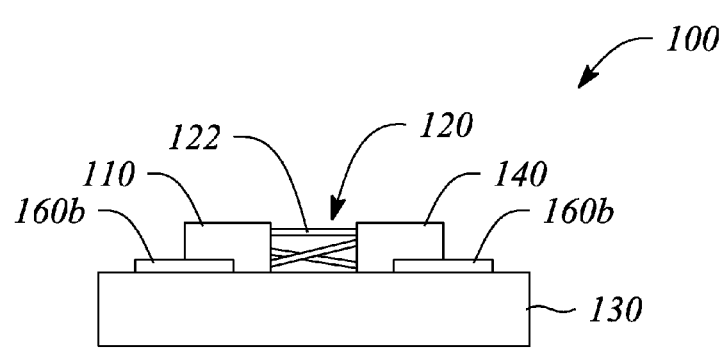
FIG. 5C illustrates a side view of a hetero-crystalline semiconductor device according to another embodiment of the present invention.

In some embodiments, the hetero-crystalline semiconductor device 100 further comprises an electrical connection to electrically access one or both of the first layer 110 and the nanostructure 122, 124. FIGS. 5A-5C illustrate side views of the hetero-crystalline semiconductor device 100 having electrical contacts 160a, 160b in accordance with various embodiments of the present invention. FIG. 5A illustrates a side view of the hetero-crystalline semiconductor device 100 of FIG. 1A with a first electrical contact 160a adjacent to the first layer 110 and a second electrical contact 160b adjacent to the nanostructure layer 120. The second electrical contact 160b connects to the second ends of the nanostructures 122 that were exposed in the encapsulating material 126. FIG. 5B illustrates a side view of the hetero-crystalline semiconductor device 100 of FIG. 2A with the first electrical contact 160a adjacent to the first layer 110 and the second electrical contact 160b adjacent to the second layer 140. The nanostructures 122 are electrically accessible in conjunction with the first and second layers 110, 140 by the first and second electrical contacts 160a, 160b, respectively. FIG. 5C illustrates a side view of a hetero-crystalline semiconductor device 100 according to another embodiment of the present invention. The hetero-crystalline semiconductor device 100 further comprises the first electrical contact 160a on the substrate 130 adjacent to the first layer 110 and the second electrical contact 160b on the substrate 130 adjacent to the second layer 140. The hetero-crystalline semiconductor device 100 illustrated in FIG. 5C is similar to a portion of the hetero-crystalline semiconductor device 100 illustrated in FIG. 2B in some embodiments. The nanostructures 122 are electrically accessible in conjunction with the first and second layers 110, 140 by the first and second electrical contacts 160a, 160b in this embodiment.

The electrical contacts 160a, 160b are made from a material that includes, but are not limited to, a conductive metal and a semiconductor material that is doped to provide the electrical conductivity for the device 100 application. In some embodiments, the material of the electrical contacts 160a, 160b is either transparent or semi-transparent to electromagnetic radiation in one or more of visible, UV and IR spectrums.

Figure 6:
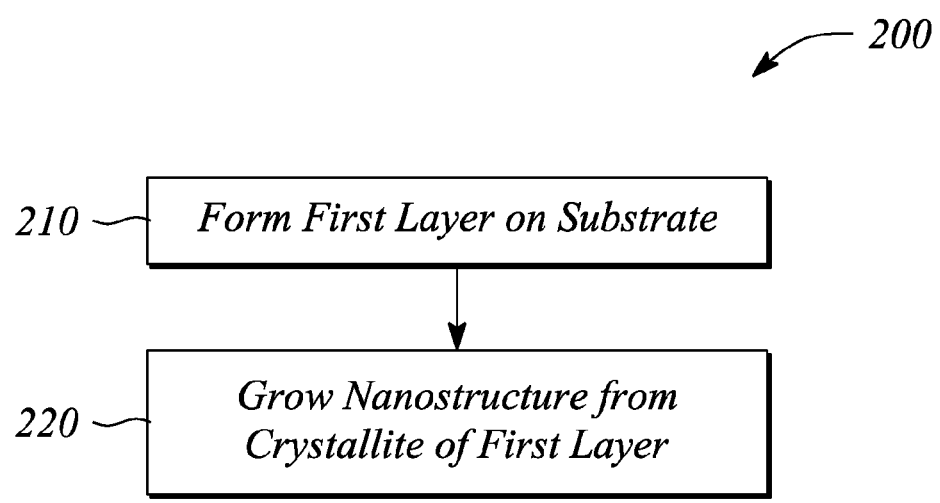
FIG. 6 illustrates a flow chart of a method of making a hetero-crystalline semiconductor device according to an embodiment of the present invention.

In another embodiment of the present invention, a method of making a hetero-crystalline semiconductor device is provided. In some embodiments, the hetero-crystalline semiconductor device provided by the method comprises a heterostructure or heterojunction. FIG. 6 illustrates a flow chart of a method 200 of making a hetero-crystalline semiconductor device according to an embodiment of the present invention. The method 200 of making the hetero-crystalline semiconductor device comprises forming 210 a first layer of a non-single crystalline semiconductor material on a surface of a substrate. The method 200 of making further comprises growing 220 a nanostructure of a single-crystalline semiconductor material from a crystallite in the first layer such that the nanostructure is integral to the crystallite. The non-single crystalline first layer and the single crystalline nanostructure provide the hetero-crystalline structure of the semiconductor device. In some embodiments, the hetero-crystalline semiconductor device is similar to the hetero-crystalline semiconductor device 100 and its applications described above.

In some embodiments, forming 210 a first layer comprises depositing a semiconductor film on the surface of the substrate in a non-single crystalline form. In some embodiments, a non-single crystalline film of a semiconductor material is deposited using a chemical vapor deposition (CVD) process, such as plasma enhanced CVD (PECVD), and a semiconductor source gas or gas mixture. For example, a non-single crystalline silicon film may be deposited onto a silicon dioxide surface of a substrate using PECVD at a temperature ranging from about 100° C. to about 300° C. and a source gas mixture of silane and hydrogen. In this example, the first layer is a non-single crystalline hydrogenated silicon film. Other methods of deposition of non-single crystalline films according to the present invention include, but are not limited to, physical vapor deposition, such as sputtering or vacuum evaporation. The first layer is formed with multiple crystallites of varying sizes, as defined above for the non-single crystalline semiconductor structure or layer. A crystallite near the surface in the first layer provides a template for nucleating with a nanostructure.

In some embodiments, growing 220 a nanostructure on the first layer comprises an epitaxial growth process to achieve a single-crystalline semiconductor nanostructure. Nanostructures, such as nanowires and nanotubes, are grown epitaxially using a variety of techniques including, but not limited to, catalytic growth using vapor-liquid-solid (VLS) growth, catalytic growth using solution-liquid-solid (SLS) growth, and non-catalytic growth using vapor-phase epitaxy. Catalytic growth is further characterized by being either metal catalyzed or nonmetal catalyzed. The growth is performed in a chemical vapor deposition (CVD) chamber in a controlled environment using a gas mixture comprising nanowire source materials. During catalytic growth, nanowires grow in a predominately perpendicular direction from <111> crystal lattice planes of respective crystallites in the first layer. Since the non-single crystalline structure of the first layer comprises crystallites with random crystal orientations, the nanowires will grow 220 in random directions from some crystallites at the surface of the first layer. For nanodots, the growth is stopped almost immediately after it is started, in some embodiments. In other embodiments, the nanodots form spontaneously on the first layer by so-called self-organized growth driven by strain associated with the difference in lattice constants between the nanodots and the crystallites in the first layer.

Typical catalyst materials are metals and nonmetals. Metal catalyst materials include, but are not limited to, titanium (Ti), platinum (Pt), nickel (Ni), gold (Au), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy.

In some embodiments, growing 220 a nanostructure comprises using a catalytic growth process. In some of these embodiments, the catalytic growth process comprises using vapor-liquid-solid (VLS) growth and a metal nanoparticle catalyst. Nanoparticle catalysts are formed on a surface of the first layer using any one of a variety of deposition processes. In some embodiments, a nucleation layer of a catalyst material is deposited on the surface by electron-beam evaporation. The nucleation layer is annealed into activated nanoparticle catalysts on the surface of the first layer, for example. In other embodiments, a metal catalyst material is deposited using electrochemical deposition using a deposition solution comprising a salt of the metal catalyst material. In some embodiments, the catalyst material may be removed from the surface of the first layer, for example, by annealing.

In other embodiments, the catalyst particles are suspended in a solution and deposited on the surface of the first layer as droplets. For example, gold colloidal particles dispersed in toluene may be delivered to the surface of the first layer in multiple droplets using a pipette, or an inkjet printhead. The toluene may be pumped away in vacuum, leaving the gold nanoparticles on the surface to act as catalysts for the VLS growth of the nanowires. In this example, the gold colloidal particles have a diameter of about 10 nm and a nominal concentration of about $5 \times 10^{15}$ ml$^{-1}$.

Nanowire growth 220 is initiated in a CVD reaction chamber using a gas mixture of a nanowire source material that is introduced into the chamber at a growth temperature and using nanoparticle catalysts that are located on the crystallites at the surface of the first layer. The activated or nucleating nanoparticle catalyst accelerates decomposition of the nanowire source material in the gas mixture, such that adatoms resulting from decomposition of the nanowire source material diffuse through or around the nanoparticle catalyst, and the adatoms precipitate on the first layer surface. In particular, the adatoms of the nanowire material precipitate between the nanoparticle catalyst and the surface of the first layer at the respective crystallites to initiate nanowire growth. Moreover, catalyzed growth of the nanowire is continued with continued precipitation at the nanoparticle-nanowire interface. Such continued precipitation causes the nanoparticle catalyst to remain at the tip of the free end of the growing 220 nanowire.

For example, indium phosphide (InP) nanowires may be grown on the non-single crystalline hydrogenated silicon film by metalorganic CVD (MOCVD) using trimethyilindium and phosphine in a hydrogen carrier gas at a growth pressure of about 76 Torr and temperature of about 430° C. The InP nanowires are anchored to the crystallites in the non-single crystalline silicon film.

In some embodiments, the method 200 of making further comprises doping one or both of the first layer and the nanostructure. In some embodiments, the first layer and the nanostructures are doped such that a p-n junction is formed. In some embodiments, the p-n junction is any of the p-n junctions 150 (including p-i-n junctions) described above for the hetero-crystalline semiconductor device 100. The dopant materials used and the dopant levels achieved are dependent on the hetero-crystalline semiconductor device application and not considered a limitation herein. In some embodiments, the method 200 of making further comprises embedding the nanostructure in an encapsulant material. In this embodiment, a free end of the nanostructure is exposed at a surface of the encapsulant. In some embodiments, the method 200 of making further comprises forming an electrical connection to electrically access one or both of the first layer and the nanostructure. The electrical connection is formed using a deposition method and either a conductive metal material or an appropriately doped semiconductor material. For example, deposition methods including, but not limited to, sputtering and evaporation may be used. In some embodiments, the electrical connection is similar to either of the electrical contacts 160a, 160b described above for the hetero-crystalline semiconductor device 100.

In some embodiments, the method 200 of making further comprises forming a second layer of a second semiconductor material having a second non-single crystalline structure, such that the nanostructure is sandwiched between the formed 210 first layer and the second layer. In some embodiments, the second layer is similar to the second layer 140 described above for the hetero-crystalline semiconductor device 100. In some embodiments, the second layer may be formed on the nanostructure or a layer that comprises the nanostructure in a vertically stacked relationship, such as that illustrated in FIG. 2A. In other embodiments, the second layer may be formed as a discrete segment on the substrate that is separated from the first layer, which is also formed as a discrete segment. The nanostructure may be grown 220 from a vertical sidewall surface of the first layer to contact a vertical sidewall surface of the second layer.

In some embodiments, the method 200 of making further comprises growing a second nanostructure on the second layer in much the same way as described above for growing 220 the first-mentioned nanostructure on the first layer. In some of these embodiments, the second layer and the second nanostructure also may be doped and p-n junctions may be formed, as described above for the first layer and the first-mentioned nanostructure. In such embodiments, the hetero-crystalline semiconductor device comprises multiple non-single crystalline semiconductor layers and multiple single crystalline semiconductor layers, wherein the semiconductor materials of each layer may be the same or different. As such, the hetero-crystalline semiconductor device made by the method 200 has different energy band gaps in the different layers that provide for numerous device applications, as described above for the hetero-crystalline semiconductor device 100.

Thus, there have been described various embodiments of a hetero-crystalline semiconductor device and a method of making a hetero-crystalline semiconductor device. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A hetero-crystalline semiconductor device comprising:
a first layer of a first semiconductor material of a substantially amorphous non-single crystalline structure; and
a nanostructure layer that comprises a plurality of nanostructures, the nanostructures being a semiconductor material having a single crystalline structure, wherein the nanostructures are integral to respective crystallites in the first layer and extend from the first layer in substantially different directions relative to each other, and wherein the first layer and the nanostructures have different material energy band gaps.

2. The hetero-crystalline semiconductor device of claim 1, further comprising a substrate adjacent to the first layer that supports at least the first layer, wherein a material of the substrate is selected from a glass, a ceramic, a metal, a plastic, a polymer, a dielectric and a semiconductor.

3. The hetero-crystalline semiconductor device of claim 1, wherein the nanostructures are nanowires.

4. The hetero-crystalline semiconductor device of claim 1, further comprising a p-n junction located one or more of in the nanostructures and between the first layer and the nanostructures.

5. The hetero-crystalline semiconductor device of claim 1, further comprising:
a first electrical contact interfaced to the first layer; and
a second electrical contact interfaced to the nanostructure layer.

6. The hetero-crystalline semiconductor device of claim 1, wherein the material energy band gap of the first layer is greater than the material energy band gap of the nanostructures.

7. The hetero-crystalline semiconductor device of claim 1, wherein the material energy band gap of the first layer is less than the material energy band gap of the nanostructures.

8. The hetero-crystalline semiconductor device of claim 1, further comprising a second layer of a second semiconductor material having a non-single crystalline structure and an energy band gap, the nanostructure layer being located between the first layer and the second layer.

9. The hetero-crystalline semiconductor device of claim 8, wherein the first semiconductor material and the second semiconductor material are the same semiconductor material.

10. The hetero-crystalline semiconductor device of claim 8, wherein the material energy band gap of the second layer is greater than the material energy band gap of the nanostructures.

11. The hetero-crystalline semiconductor device of claim 8, wherein the material energy band gap of the second layer is less than the material energy band gap of the nanostructures.

12. A hetero-crystalline semiconductor device comprising:
a first layer of a first non-single crystalline semiconductor material having a substantially amorphous structure and having a first material energy band gap;
a second layer of a second non-single crystalline semiconductor material having a second material energy band gap that is different from the first material energy band gap;
a nanostructure layer comprising nanostructures of a single crystalline semiconductor material having a third material energy band gap, a nanostructure of the nanostructure layer being integral to a crystallite in one of the first layer and the second layer, the nanostructures extending in substantially different directions relative to one another, wherein the nanostructure layer is located between the first layer and the second layer; and
separate electrical contacts to the first layer and the second layer, the nanostructures being electrically accessible by the separate electrical contacts.

13. The hetero-crystalline semiconductor device of claim 12, wherein the third material energy band gap of the single crystalline semiconductor material is different from one or both of the first material energy band gap of the first non-single crystalline semiconductor material and the second material energy band gap of the second non-single crystalline semiconductor material.

14. The hetero-crystalline semiconductor device of claim 12, wherein the nanostructure layer further comprises a material in which the nanostructures are embedded, the nanostructures being one of nanowires and nano dots.

15. The hetero-crystalline semiconductor device of claim 12, further comprising a p-n junction located one or more of in the nanostructures, between the first layer and the nanostructures, between the second layer and the nanostructures, and between the first layer and the second layer.

16. The hetero-crystalline semiconductor device of claim 12, wherein the first layer is located on a surface of a substrate, the second layer being vertically spaced from the first layer by the nanostructure layer.

17. The hetero-crystalline semiconductor device of claim 12, wherein the first layer and the second layer alternate across a surface of a substrate as discrete segments having vertical sidewalls, the nanostructures laterally extending between vertical sidewalls of the alternating discrete segments.

18. A method of making a hetero-crystalline semiconductor device comprising:
forming a first layer of a first non-single crystalline semiconductor material having a substantially amorphous structure on a surface of a substrate; and
growing a plurality of nanostructures of a single-crystalline semiconductor material from respective crystallites in the first layer, the nanostructures being integral to the respective crystallites and extending from the first layer in substantially different directions relative to each other, wherein the first layer and the nanostructures have different material energy band gaps.

19. The method of making of claim 18, further comprising:
forming a second layer of a second non-single crystalline semiconductor material such that the nanostructures are located between the first layer and the second layer;
doping one or more of the first layer, the nanostructures and the second layer; and
forming an electrical contact to electrically access one or more of the first layer, the second layer and the nanostructures.

20. The method of making of claim 18, wherein growing the plurality of nanostructures comprises using catalytic epitaxial growth.

* * * * *